United States Patent [19]
Yim

[11] Patent Number: 5,869,395
[45] Date of Patent: Feb. 9, 1999

[54] SIMPLIFIED HOLE INTERCONNECT PROCESS

[75] Inventor: Randy M. Yim, Pleasanton, Calif.

[73] Assignee: LSI Logic Corporation, Milpitas, Calif.

[21] Appl. No.: 786,695

[22] Filed: Jan. 22, 1997

[51] Int. Cl.⁶ .................................................. H01L 21/469
[52] U.S. Cl. .......................... 438/637; 438/666; 438/700; 438/948; 438/640; 438/673
[58] Field of Search ................................... 438/637, 666, 438/700, 725, 948, 640, 673

[56] References Cited

U.S. PATENT DOCUMENTS

| | | |
|---|---|---|
| 4,758,305 | 7/1988 | Bonifield et al. . |
| 5,288,660 | 2/1994 | Hua et al. . |
| 5,380,621 | 1/1995 | Dichiara et al. . |
| 5,691,238 | 11/1997 | Avanzino et al. . |

OTHER PUBLICATIONS

Carter C. Kaanta, et al. "Dual Damascene:A ULSI Wiring Technology"Jun. 11–12, 1991 VMIC Conference, Proc. of the 8th International VMIC Conf. IEEE, Calif.

*Primary Examiner*—Caridad Everhart
*Attorney, Agent, or Firm*—Marger, Johnson & McCollom, P.C.

[57] ABSTRACT

The subject invention is directed to a method for producing semiconductor wafers using a simplified hole interconnect process. These wafers include at least one interconnect layer located on a contact or via layer. As contrasted with the semiconductor wafers produced according to the prior art method described above, the contact or via layer of this invention includes a plurality of patterned openings formed therein which are in substantial alignment without offset with each other.

20 Claims, 4 Drawing Sheets

SIMPLIFIED HOLE INTERCONNECT PROCESS

BACKGROUND OF THE INVENTION

This invention relates to the field of methods for processing semiconductor materials, and in particular to methods for overcoming alignment offset problems in the fabrication of a semiconductor which can exist between an interconnect layer and a contact layer or between an interconnect layer and a via layer, which thereby provide a simplified hole inconnect process.

Many semiconductor processes employ fabrication steps in which aligned openings are formed in adjacent interconnect and contact layers or in adjacent interconnect and via layers. The interconnect layer is typically a metal layer and the contact layer or via layer is typically an insulating/dielectric layer. However, a significant problem exists in that instead of being in substantial alignment with each other, the opening in the interconnect layers can easily become offset during processing unless substantial steps are undertaken to avoid such misalignment.

Figures 1A, 1B, 1C, 1D, 1E, 1F, 1G, 1H, 1I:
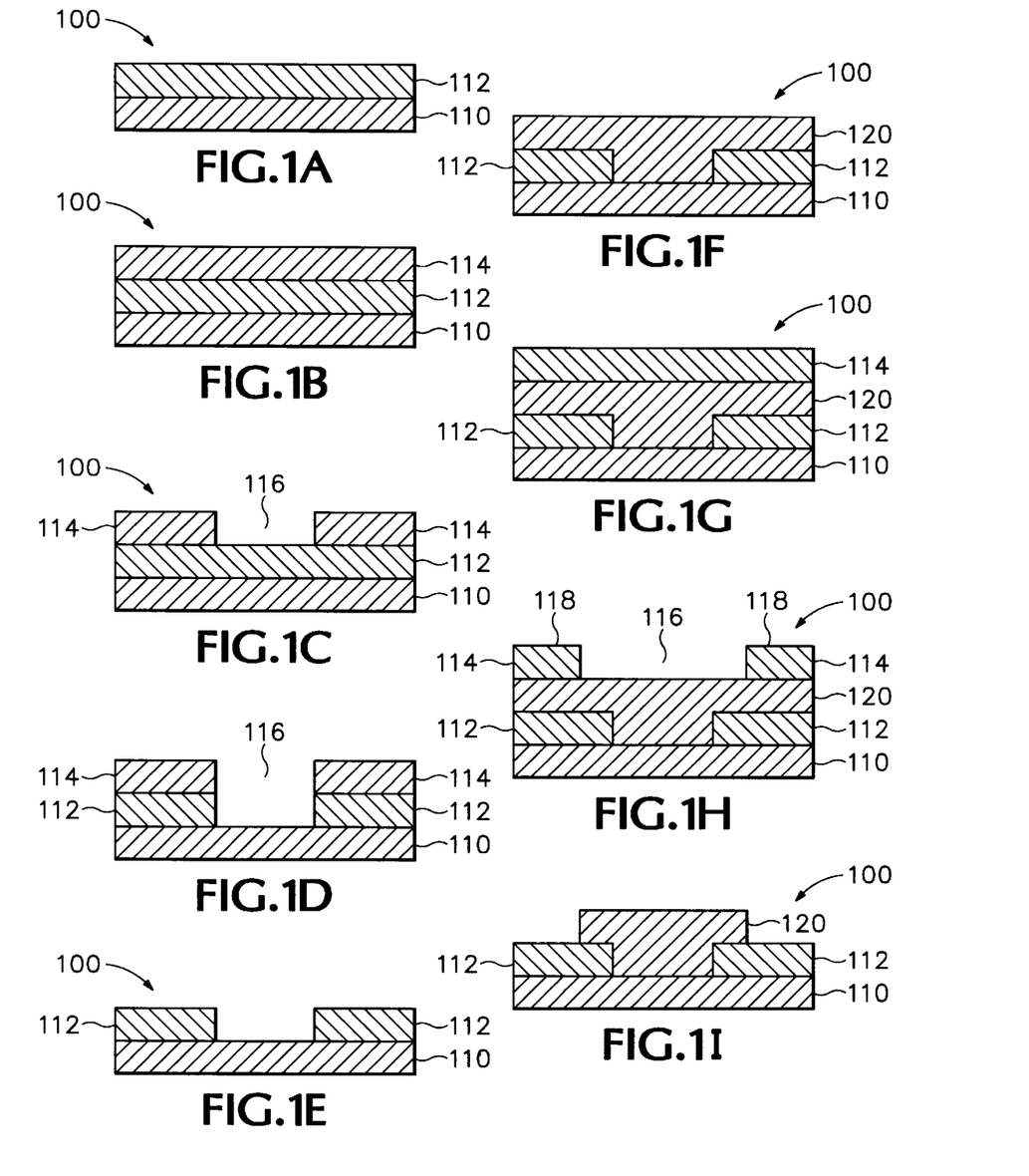
FIGS. 1A–1I are cross-sections of a semiconductor substrate in various stages of processing in accordance with prior art methods.

In order to overcome the above-described offset alignment problem, a number of additional incremental steps have been introduced to augment prior art semiconductor 100 fabrication schemes. In known commercial processes, the formation of a contact or via hole pattern requires a number of method steps. For example, as shown in FIG. 1A, an insulating/dielectric layer 112 is first deposited onto a substrate layer 110. Then, a series of resist photomasking process must be employed.

As shown in FIG. 1B, a resist layer 114 is, for instance, spun onto an contact insulating/dielectric layer 112 which was previously disposed onto an underlying silicon wafer substrate 110. Then, as seen in FIG. 1C, the resist 114 is exposed using UV light and then developed to form a three dimension relief image in a predetermined pattern including openings 116 in the resist layer down to the insulating/dielectric layer 112. Next, the insulating/dielectric layer 112 is etched through the contact opening 116 in the resist layer 114 down to the silicon substrate 110, employing conventional etching techniques (see FIG. 1D), followed by removal of the resist layer 114 from the surface of the insulating/dielectric layer 112 (see FIG. 1E).

In FIG. 1F, an interconnect layer 120, which is typically formed of a metallic material, is then deposited into the contact opening 116 and onto the patterned insulating/dielectric layer 112. This necessitates employing another resist photomasking sequence which includes the processing steps needed to align the openings in the subsequently etched interconnect pattern and the openings in the previously formed insulating/dielectric layer hole pattern (see FIG. 1G). Once the resist layer 114 is spun on, and the requisite predetermined pattern formed therein (see FIG. 1H), the interconnect layer 120 is etched through the openings 118 in the resist layer 114 down to the insulating/dielectric substrate 112, employing conventional etching techniques (see FIG. 1I). After etching of the interconnect layer 120 is completed, the interconnect pattern remaining on the underlying contact film, creates a topography needing special subsequent planarizing techniques.

Disadvantages of the above-described known methods are the increased number of photomasking and etch processing steps, the additional alignment tolerances needed between interconnect and hole layers, the increased step height between interconnect vs. non-interconnect areas, and the need for additional post-interconnect pattern contact planarization processing steps.

There is thus a need exists for simplifying the above-described processes to reduce the cost of semiconductor wafer manufacture while providing a process which eliminates alignment offset problems between an interconnect layer and a contact layer or between an interconnect layer and a via layer.

SUMMARY OF THE INVENTION

The above-described needs have been met by the process of the present invention which enables the elimination of the above-described alignment tolerances between the hole and interconnect layers in the design rules thereby increasing design rule density. Moreover, the semiconductor wafer fabrication cost is greatly reduced due to the elimination of several photomasking, etching, and planarization steps, while improving defect density and saving on the cost of materials, labor, and throughput time. Also, with the improved planarization, the photolithography and etch process windows are enlarged, making for a more manufacturable process.

The subject invention is directed to a method for producing semiconductor wafers. These wafers include at least one interconnect layer located on a contact or via layer. As contrasted with the semiconductor wafers produced according to the prior art method described above, the contact or via layer of this invention includes a plurality of patterned openings formed therein which are in substantial alignment without offset with each other.

More specifically, the method of the present invention comprises providing a silicon wafer substrate, a light source for transmitting a specific amount and wavelength of U.V. light in a selected pattern onto a resist material, and a work space within which the silicon wafer substrate is located during the selected light patterning step.

Next, the contact or via layer is formed on the silicon wafer substrate. The contact or via layer typically comprises a insulating/dielectric layer and the interconnect layer comprises a metallic layer.

Then, the above-described silicon wafer substrate has a layer of a multi-functional masking material formed on an outer surface of the contact or via layer. This masking material has a plurality of develop rates each of which is directly dependent upon the amount and wavelength of patterned light being transmitted to the resist material by the U.V. light source. The multi-functional masking material preferably comprises a DUV photoresist material, and more preferably comprises a positive tone DUV photoresist material.

The photomasked semiconductor wafer is then introduced into the work space. The work space is typically located within a stepper or scanner or a step-and-repeat projection system. Without removing the semiconductor wafer from the work space, a set of openings in selected masking patterns at selected locations in the masking material are formed by transmitting amounts of light in selected light wavelengths from light source in the selected light pattern to the selected locations which creates chemical reactions in the resist in selected resist patterns at various develop rates.

Preferably, the step of forming a plurality of openings in selected masking patterns at selected locations in the masking material in the work space comprises the steps of exposing the masking material to a first masking pattern for forming openings in the photoresist material at a depth substantially down to the contact or via insulating layer.

Then, the masking material is exposed to a second masking pattern for forming the interconnect pattern in the photoresist material above the contact or via insulating layer. Moreover, the second masking pattern can be designed for forming openings in the photoresist material which are at a depth of about 50% of the thickness of the photoresist material. The selected masking pattern more preferably comprises completely open contacts or vias in the photoresist material at a depth of about 100% of the resist thickness, partially open areas in the photoresist material at a depth of about 50% of the resist thickness where interconnect lines will be subsequently formed, unopened areas in the photoresist material with full resist thickness remaining over the area where no interconnect lines or contacts or vias will be subsequently formed.

One method for directly varying the depth of the photoresist pattern created in the photoresist material is to vary the transmission of the chrome of the photomask. This is preferably accomplished by forming a set of openings in selected masking patterns at selected locations in the masking material by transmitting a first amount of light in a selected light wavelength from a light source through a first reticle with a contact or via hole pattern 0% transmission chrome in a first selected light pattern to the selected location site. Then, without removing the semiconductor wafer from the work space, a second amount of light is transmitted in a selected light wavelength from the light source through a second reticle, preferably with an interconnect pattern in about a 50% transmission chrome, in a second selected light pattern, to selected location sites.

The contact or via layer and the interconnect layer patterns are then developed in the selected resist patterns at the set of the selected opening locations to form a plurality of patterned openings which are in substantial alignment without offset with each other. Next, the multi-step etch is conducted which is comprised of a partial contact or via layer etch step, followed by a resist etch to clear the 50% resist thickness representing the interconnect layer, and then a partial insulating layer etch to completely remove the insulating layer in the contact or via openings and to partially remove the insulating layer in the interconnect openings. Once the etching step is complete, the layer of photoresist material is removed.

Finally, the interconnect material is deposited in the contact or via openings and the interconnect layer openings. Then, the deposited interconnect material is polished down to the contact or via layer surface, preferably using chemical mechanical polishing techniques, resulting in selected opening locations which are in substantial alignment without offset with each other.

There are a number of advantages of the proposed method. First, the alignment tolerance between hole and interconnect pattern layers decreases effectively to zero since both layers are aligned on the stepper or scanner consecutively without removing the wafer from the stage and using the same modeling coefficients. This allows for much tighter design rules, resulting in higher packing densities. Second, one entire photomasking step, one entire etch step, and one entire planarization step is eliminated for each level of interconnect in the process. This not only improves defect density, but also reduces throughput time. Third, topography is eliminated, resulting in increased depth of focus process latitude in photolithography and less stringent requirements for etching high and low topography holes. Both defect density and manufacturability are improved. Fourth, there is an elimination of the interconnect scribeline alignment, measurement, and etch monitor structures, allowing room for other test structures or possibly reducing the scribeline area. Fifth, the use of a new DUV positive tone photoresist whose thickness remaining after dissolution is dependent upon the reticle chrome transmission percentage. Sixth, is the implementation of the damascene process resulting in flat topography in conjunction with the single process hole and interconnect pattern definition.

The foregoing and other objects, features and advantages of the invention will become more readily apparent from the following detailed description of a preferred embodiment which proceeds with reference to the drawings.

BRIEF DESCRIPTION OF THE DRAWINGS

FIGS. 4A–4$h$ are cross-sections of an alternative interconnect layer formation method in accordance with the present invention using the dual damascene process.

DETAILED DESCRIPTION OF A PREFERRED EMBODIMENT

Figure 2A:
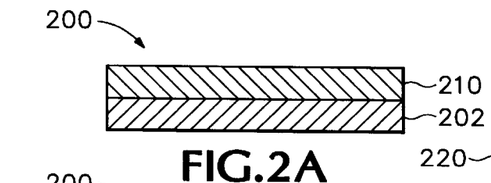
FIGS. 2A–2K are cross-sections of a semiconductor substrate in various stages of processing in accordance with the present invention.

Referring to FIG. 2A there is shown a semiconductor wafer 200 comprising a substrate 202 and an insulating/dielectric layer 210 which can act as a contact or via layer in accordance with the present. Insulating/dielectric layer 210 forms a protective barrier for substrate 202 and allows various materials to be exposed by selective etching, as described herewith in greater detail below.

The thickness of insulating/dielectric layer 210 is selected to allow semiconductor wafer 200 to proceed through various modifications of insulating/dielectric layer 210. Typically, insulating/dielectric layer 210 preferably has a thickness between 7,000 Å and 10,000 Å for the first hole pattern, and preferably between 10,000 Å and 20,000 Å for subsequent hole patterns.

Insulating/dielectric layer 210 may be formed by a variety of known processes. The most common methods, however, are oxidizing silane with oxygen at low pressure and temperature (typically 400–450 degrees C.) and decomposing tetraethylorthosilicate or tetraethoxysilane, with or without oxygen at low pressure and at a temperature between 650–750 degrees C. The preferred formation process is chemical vapor deposition (CVD) for the first hole pattern, and plasma-enhanced chemical vapor deposition (PECVD) for hole patterns once a metal interconnect layer pattern is on the wafer, which can be conducted at low temperature, typically 400 degree C. or lower.

Figure 2B:
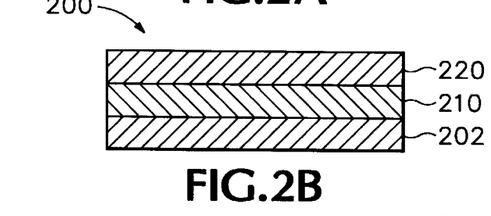

Referring now to FIG. 2B, once insulating/dielectric layer 210 has been deposited onto the substrate 202, a single photoresist masking step is conducted. In this case, a multi-functional photoresist material is employed having a develop rate which is dependent upon the amount of UV light transmitted and is capable of having formed therein a pattern of selected multiple opening configurations. Conventional optical lithography techniques are generally employed. An optical lithography tool typically consists of an utraviolet (UV) light source, a photomask, an optical system, and wafer covered with a photoresist layer. The mask is flooded with UV light from the light source and the mask pattern is imaged onto the resist by the optical system.

The most commonly used UV light sources for optical lithography are high-pressure arc lamps and laser sources.

Three regions of the emitted light spectrum are readily distinguished for photoresist patterning purposes: deep ultraviolet (DUV) in the 200–300 nm range, mid-UV in the 300–360 range, and near-UV in the 360–450 range. An exemplary multi-functional photoresist formation process to form photoresist layer 220 is described as follows:

a. Pretreat the wafer with an adhersion promoter such as hexamethyldisilazane.

b. Spin a photoresist material to form photoresist layer 220.

c. Remove any edge bead of photoresist material.

d. Softbake the photoresist material to remove resist solvent and increase resist wafer adhesion.

Photoresist 220 is spun on as an organic film. The thickness of photoresist 220 is selected to mask the underlying areas of insulating layer 210 against etching. The typical thickness for photoresist mask 220 is between about 0.7 µm and 1.5 µm, and preferably between about 0.8 µm and 1.0 µm.

By employing the subject multi-functional photoresist formation process, a contact or via layer opening 230 and an interconnect layer opening 240 can be respectively produced which are within the requisite offset tolerances. The entire process for developing the photoresist is conducted while maintaining the semiconductor wafer 200 in position within a given work space in the photoresist formation area. Semiconductor wafer 200 is depicted in FIG. 2B following the spinning on of the photoresist mask 220.

The multi-functional photoresist layer 220 is preferably a DUV photoresist material, and more preferably a positive tone DUV photoresist, having a develop rate which is directly dependent upon the DUV light transmitted through the photomask. For example, if a positive DUV resist is employed, a 0% chrome pattern leaves about a 100% photoresist thickness, a 50% transmission chrome pattern leaves about a 50% photoresist thickness, and no chrome pattern leaves about a 0% photoresist thickness. In this way, a plurality of contact or via openings in selected masking patterns can be formed using this multi-functional photoresist layer 220 without removing the semiconductor wafer 200 from the work space in the photomask printing area. The ability to conduct the mask patterning operation in a single work space will in turn facilitate the formation of openings in selected masking patterns in selected locations in the masking material which, unlike the prior method described in FIGS. 1A–1I, are in substantial alignment without offset with each other. The preferred DUV photoresist materials employed in the process of the present invention is the DUV photoresist developed and manufactured by IBM.

Figure 2C:
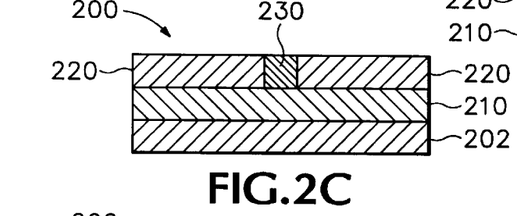
Figure 2D:
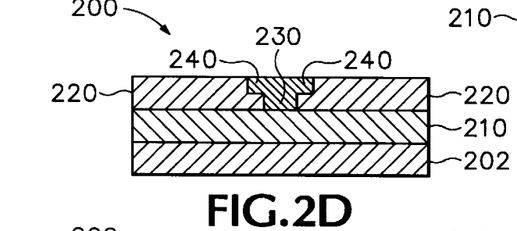
Figure 2E:
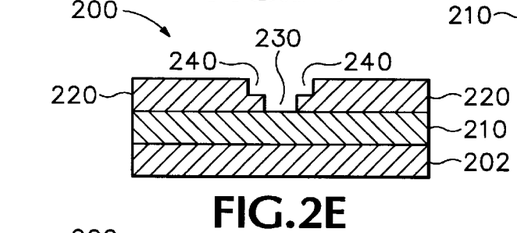

The preferred photoresist etch pattern development scheme for multi-functional photoresist layer 220 is shown in FIGS. 2C, 2D and 2E. The most commonly used imaging technique is projection printing using a conventional image projection system in which lens assemblies are used to focus the mask pattern onto the semiconductor wafer 200 which is separated from the mask typically by a distance of several centimeters. The most widespread printing technology used today is the step-and-repeat projection system. Scanners are also employed for photomask printing purposes. The subject photoresist process can be conducted in any of these image projection systems.

As depicted in FIG. 2C, a first hole pattern 230 generated using a previously aligned and loaded first hole pattern reticle in an image projection system such as a conventional Stepper or Scanner which is exposed with a standard dose of a standard 0% transmission chrome. The preferred conditions for generating a predetermined dose of light from the subject DUV light source that is needed in the formation of first hole pattern 230, is as follows:

a. Form a focus/expose matrix sample wafer coated with the requisite photoresist material.

b. Take the wafer from prior step a. through a standard resist develop cycle.

c. Measure the opening dimension formed using a CD SEM metrology tool.

d. Determine the optimum dose and focus for a given opening size.

Figure 2F:
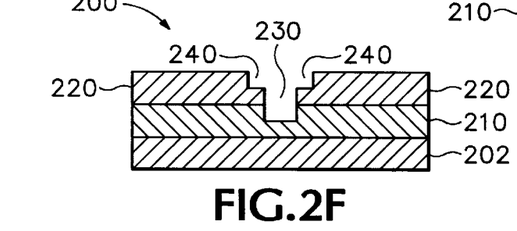
Figure 2G:
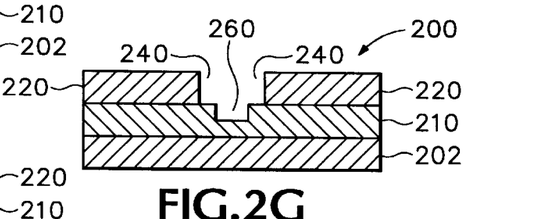
Figure 2H:
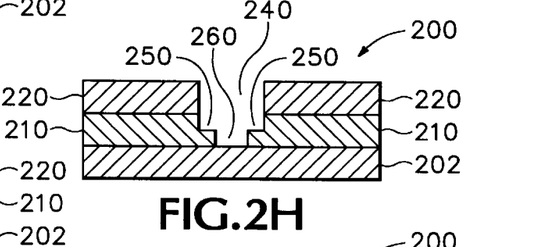

Next, without removing wafer 200 from within the confines of the image projection system employed, as shown in FIG. 2D, an inverse interconnect pattern is generated with a standard dose of a 50% transmission chrome from a previously aligned and loaded reverse interconnect pattern reticle which is exposed to form an opening 240 having a width as required for the subsequent interconnect opening 250 (See FIG. 2H). The preferred conditions for generating a predetermined dose of light from the subject DUV light source that is needed in the formation of interconnect opening pattern, is as follows:

a. Form a focus/expose matrix sample wafer coated with the requisite photoresist material.

b. Using a 50% transmission chrome reticle, take the wafer from prior step a. through a standard resist develop cycle.

c. Measure the opening dimension formed using a CD SEM metrology tool and the depth with an atomic force microscope tool.

d. Determine the optimum dose and focus for a given opening size and depth.

In an alternative embodiment of the present invention, the hole pattern and inverse interconnect pattern reticles are combined into a single reticle. More specifically, a combination opening and inverse interconnect pattern reticle is provided including respective 0% transmission (opaque), 50% transmission (translucent) and 100% transmission (transparent) chrome areas. The use of a single reticle structure eliminates the extra reticle load and wafer exposure steps, along with eliminating any stepper or scanner reticle alignment errors.

Next, the wafer proceeds through standard Post Exposure Bake (PEB) which is employed primarily to reduce standing wave effects by reducing the ridges at the resist edges and to reduce airborne contamination incorporation into the DUV resist. Then, the resist is developed using conventional developer technology. Development is a critical step in resist processing playing a key role in defining the shape of the resist profile and controlling the line-width of the interconnect layer. Finally, a post-development hardbake is performed by standard methods to give the remaining resist images the adhesion necessary to withstand subsequent processing steps such as in this case, etching.

The semiconductor wafer depicted in FIG. 2E is then subjected to a series of sequential etching steps. An exemplary sequence is described in FIGS. 2F–2H. The initial etching step as described therein is a standard anisotropic etch, for example, $CF_4$, $C_2F_6$, or $CHF_2$ gas chemistry using RIE (Reactive Ion Etch), MERIE (magnetically enhanced RIE), or ICP (Inductive Coupled RF Plasma) etching techniques. The initial etching step is continued until it reaches about half the depth of the opening in the insulating/ dielectric layer as shown in FIG. 2F.

Next, the etch chemistry is changed to reduce resist selectivity in order to clear away the 50% resist thickness areas to produce the configuration described in FIG. 2G. This is accomplished using a standard etch. For example, modification of the O₂ and Ar gas ratio in the main etch gas using RIE, MERIE, or ICP etching techniques.

The final etching step reverts back to the anisotropic etch, as previously described. This will completely etch away the full hole depth and define the trenches for future interconnect lines as depicted in FIG. 2H.

Figure 2I:
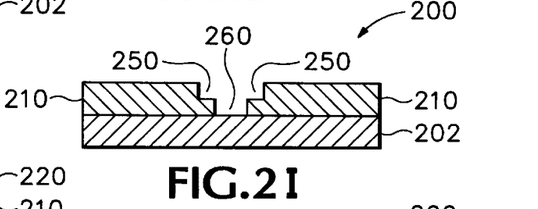

In preparation for forming an interconnect layer 270, photoresist mask 220 is stripped away from the semiconductor wafer 200. Referring now to FIG. 2H, there is shown a cross-section of semiconductor wafer 200 following removal of photoresist mask 220. Photoresist mask 220 may be removed by means of chemical solvents appropriate for the photoresist material or by etching the photoresist material in an oxygen plasma using a known "ashing" process. FIG. 2I reveals semiconductor wafer 200 having exposed surface formed by insulating layer 210.

Figure 2J:
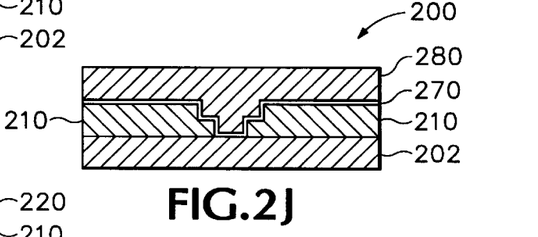
Figure 2K:
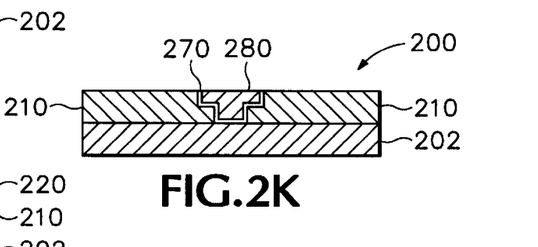

Finally, an interconnect layer 270 is formed by depositing a metal layer onto the exposed surface formed by insulating layer 210 as shown in FIG. 2J, and then performing standard chemical-mechanical polishing (CMP) to achieve a planar surface over the entire semiconductor wafer 200 as in FIG. 2K. This leaves interconnect filled contact trenches which form the interconnect lines. Interconnect layer 270 can be formed of the following metallic materials: barrier metals such as TiN or TiW, and metal alloys such as AL—Si—Cu, Al—Cu, or Cu per se. The layer 270 can be formed employing any of the following deposition techniques: Reactive Evaporation, Reactive Sputtering, Single Target Sputtering, PVD or CVD.

Figure 3:
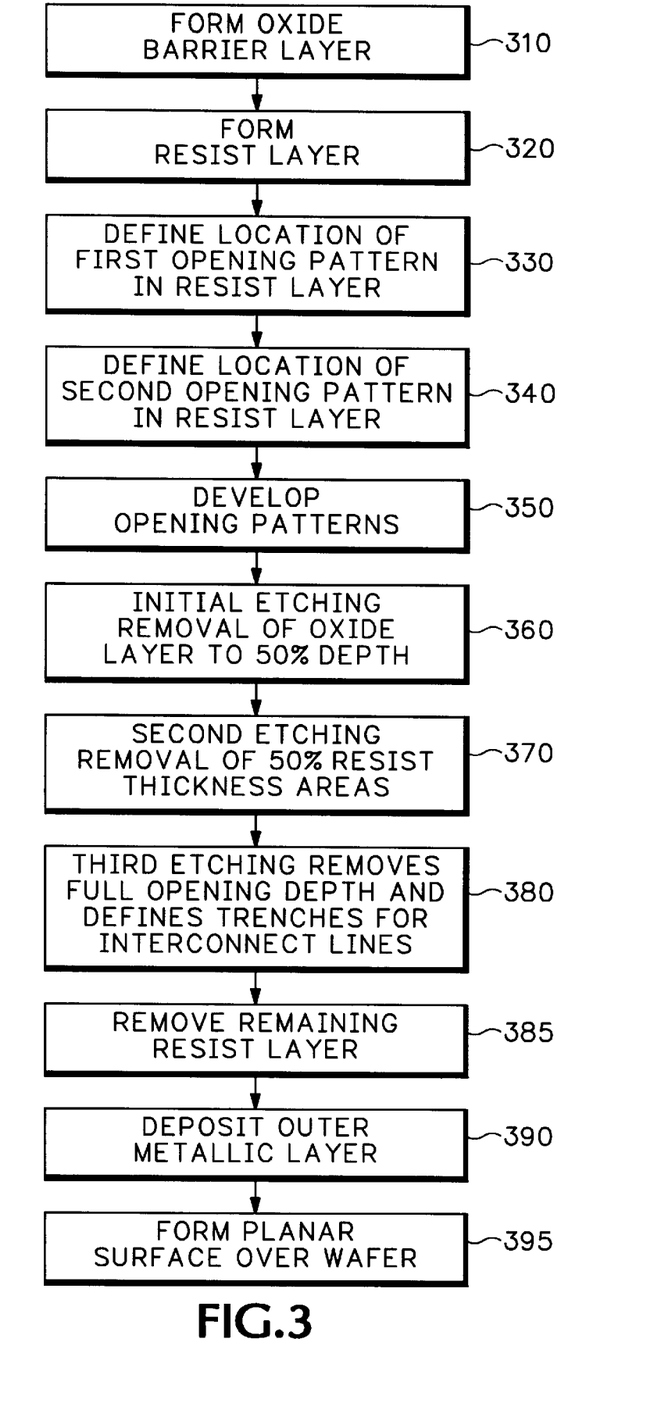
FIG. 3 is a flow chart representing the states of the process shown in FIGS. 2A–2K.

Referring now to FIG. 3, there is shown a flow chart summarizing the method of the present invention for producing. An oxide barrier 210 is formed 310 on substrate 202 and resist layer 220 is formed 320 thereon. The location of a first opening pattern 230 in the resist layer 220 is defined 330. The location of a second opening pattern 240 in the resist layer 220 is defined 340. Then, the patterns 230 and 240 are developed 350. Initial etching step 360 removes the oxide layer 260 down to a 50% depth. The second etching step 370 removes the 50% photo-resist mask. The third etching step 380 forms the full opening depth 250 thereby defining the trenches for the interconnect lines. Next, the remaining resist material is removed 385 from the wafer 200. Finally, an interconnect layer is deposited 390 onto wafer 200 in the form of inner and outer barrier metal layers 270 and 280. A planar surface is then formed 395 over the wafer 200 by CMP.

Another semiconductor formation sequence which can employ the simplified hole interconnect process of the present invention utilizes a dual damascene process. A particular preferred form of dual damascene process used in accordance with the teachings of this invention to form a multi-layer structure comprising a plurality of oxide layers having aligned openings is pictorially shown in FIGS. 4A–4h.

Figure 4A:
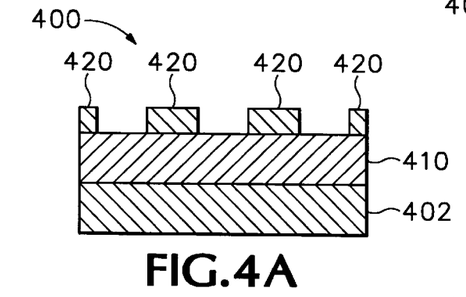
Figure 4B:
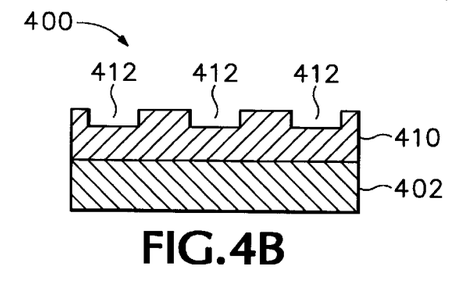

More specifically, FIG. 4A shows a multi-functional resist layer 420, developed in a predetermined etch pattern, on a PECVD oxide layer 410 which is deposited onto a silicon substrate 402. Next, the PECVD oxide layer 410 is etched using a standard anisotropic etch as previously described to form an opening 412. This etching step is continued until the opening 412 reaches a desired depth, following removal of photoresist mask 420, as shown in FIG. 4B. The etching and resist removal techniques employed have been previously described herein.

Figure 4C:
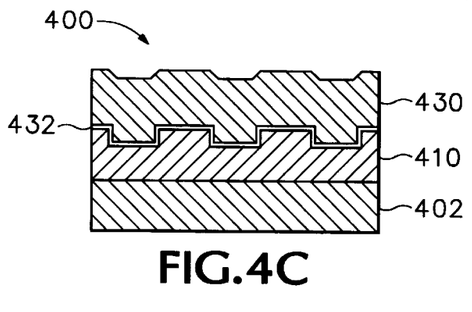

Next, an interconnect layer is formed by depositing a multi-layer of metals, outer layer 430 and inner layer 432, onto the PECVD oxide layer 410 as shown in FIG. 4C. The metal combination provided herein is a inner layer of Ti and an outer layer of Cu. However, other metal combinations as previously described herein can be employed. The outer layer 430 is planarized by performing standard chemical-mechanical polishing (CMP) to achieve a planar surface over the entire semiconductor wafer 400 within the etched opening 412. The interconnect layer 270 can be formed using the deposition techniques previously described herein.

Figure 4D:
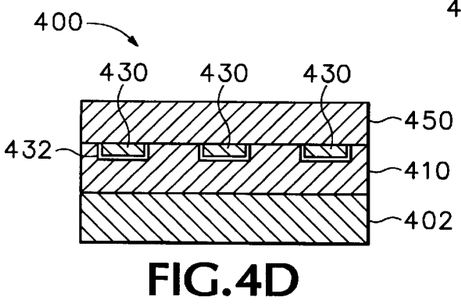
Figure 4E:
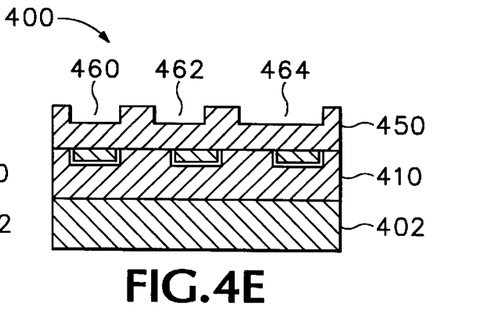
Figure 4F:
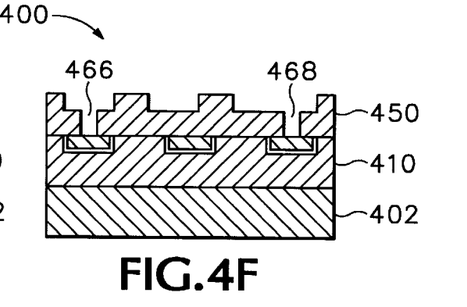

As depicted in FIG. 4D, a second oxide layer 450 is deposited onto the outer surface of the wafer 400 formed in the previous metalization step. Deposition is again by PECVD techniques. Then, the preferred photoresist etch pattern development scheme, using a multi-functional photoresist layer similar to layer 220 shown in FIGS. 2C, 2D and 2E, is repeated in FIGS. 4E and 4F to form openings 460, 462, 464, 466, and 468, or other openings of differing or similar predetermined configurations. As before, it is important that the initially formed opening have the dimension required for facilitating the formation of subsequent interconnect openings.

Figure 4G:
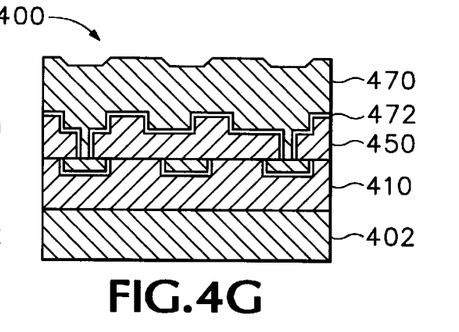
Figure 4H:
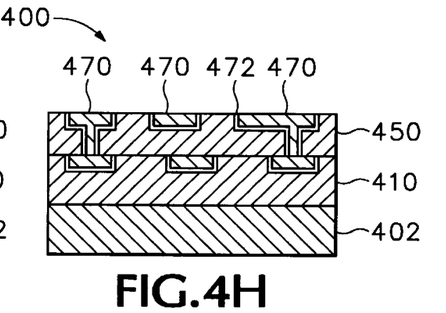

Finally, a second metalization step is conducted, for depositing an inner layer 472 and an outer layer 470, and then planarizing outer layer 470, as shown in FIGS. 4G and 4H, which is conducted in a similar manner to the metalization step depicted in FIG. 4C, which has been previously described herein.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method for producing semiconductor wafers including having at least one interconnect layer located on a contact or via layer, the contact or layer having a plurality of patterned openings formed which are in substantial alignment without offset with each other, comprising the steps of:

(a) providing a silicon wafer substrate, a light source for transmitting a specific amount and wavelength of U.V. light in a selected pattern onto a resist material, and a work space within which said silicon wafer substrate is located during said selected light patterning step;

(b) forming said contact or via layer on said silicon wafer substrate;

(c) introducing said silicon wafer substrate having said contact or via layer and said contact layer formed thereon into said workspace;

(d) forming a masking layer consisting essentially of a single layer of a multi-functional masking material on an outer surface of said contact or via layer, said masking material having a plurality of develop rates each of which is directly dependent upon the amount and wavelength of patterned light being transmitted to the resist material by the U.V. light source;

(e) forming within said work space, without removing said semiconductor wafer therefrom, a set of openings in selected masking patterns at a plurality of resist thicknesses at selected locations in said masking layer by transmitting amounts of light in selected light wavelengths from light source in said selected light pattern to said selected locations which develops said resist in selected resist patterns at various develop rates;

(f) etching said contact or via layer in said selected resist patterns at the set of said selected opening locations to form a plurality of patterned openings at a plurality of resist thicknesses which are in substantial alignment without offset with each other;

(g) removing said masking layer; and (h) forming said interconnect layer on said contact or via layers within said selected opening locations which are in substantial alignment without offset with each other.

2. The method of claim 1, wherein the multi-functional masking material comprises a DUV photoresist material.

3. The method of claim 2, wherein the DUV photoresist material comprises a positive or negative tone DUV photoresist material.

4. The method of claim 1, wherein the contact or via layer comprises a insulating or dielectric layer and said interconnect layer comprises a metallic or metallic composite layer.

5. The method of claim 1, wherein the step of forming a plurality of openings in selected masking patterns at selected locations in said masking material in said work space comprises the steps of exposing said masking layer to a first masking pattern for forming openings in said contact or via layer in the masking layer, and then exposing said masking layer to a second masking pattern for forming said openings in said contact or via layer in the masking layer.

6. The method of claim 5, wherein the second masking pattern is designed for forming openings in said contact or via layer which are at a depth less than the thickness of said masking layer.

7. The method of claim 1, wherein said selected masking pattern comprises completely open contacts or vias in said photoresist layer at a depth less than the thickness of the resist thickness over the area where interconnect lines will be subsequently formed and at a depth over the area where no interconnect lines will be subsequently formed which is more than the depth of the open contacts or vias.

8. The method of claim 1, which further includes the step of varying the % transmission of the transmission chrome of the photomask which varies the U.V. light being transmitted through said photomask and thereby directly varies the depth of the photoresist pattern created in said photoresist layer.

9. The method of claim 1, wherein said work space is located within a stepper or scanner or a step-and-repeat projection system.

10. The method of claim 8, wherein the step of forming said set of openings in selected masking patterns at selected locations in said masking layer comprises transmitting a first amount of light in a selected light wavelength from a light source through a first reticle in a first selected light pattern to said selected location site, then, without removing said semiconductor wafer from said work space, transmitting a second amount of light in a selected light wavelength from said light source through a second reticle in a second selected light pattern to selected location sites.

11. A method for using an image projection system for photomask formation for producing semiconductor wafers including having at least one interconnect layer located on a contact or via layer, said contact or layer having a plurality of patterned openings formed which are in substantial alignment without offset with each other, comprising the steps of:

(a) providing a silicon wafer substrate, a light source for transmitting a specific amount and wavelength of U.V. light in a selected pattern onto a resist material, and said image projection system for photomask formation defining a work space within which said silicon wafer substrate is located during said selected light patterning step;

(b) forming said contact or via layer on said silicon wafer substrate;

(c) introducing said silicon wafer substrate having said contact or via layer and said contact layer formed thereon into said workspace;

(d) forming a masking layer consisting essentially of a single layer of a multi-functional masking material on an outer surface of said contact or via layer, said masking material having a plurality of develop rates each of which is directly dependent upon the amount and wavelength of patterned light being transmitted to the resist material by the U.V. light source;

(e) forming within said work space, without removing said semiconductor wafer therefrom, a set of openings in selected masking patterns at a plurality of resist thicknesses at selected locations in said masking layer by transmitting amounts of light in selected light wavelengths from light source in said selected light pattern to said selected locations which develops said resist in selected resist patterns at various develop rates;

(f) etching said contact or via layer in said selected resist patterns at the set of said selected opening locations to form a plurality of patterned openings at a plurality of resist thicknesses which are in substantial alignment without offset with each other;

(g) removing said masking layer; and (h) forming said interconnect layer on said contact or via layers within said selected opening locations which are in substantial alignment without offset with each other.

12. The method of claim 11, wherein the multi-functional masking material comprises a DUV photoresist material.

13. The method of claim 12, wherein the DUV photoresist material comprises a positive or negative tone DUV photoresist material.

14. The method of claim 11, wherein the contact or via layer comprises a insulating or dielectric layer and said interconnect layer comprises a metallic or metallic composite layer.

15. The method of claim 11, wherein the step of forming a plurality of openings in selected masking patterns at selected locations in said masking material in said work space comprises the steps of exposing said masking layer to a first masking pattern for forming openings in said contact or via layer in the masking layer, and then exposing said masking layer to a second masking pattern for forming said openings in said contact or via layer in the masking layer.

16. The method of claim 15, wherein the second masking pattern is designed for forming openings in said contact or via layer which are at a depth less than the thickness of said masking layer.

17. The method of claim 11, wherein said selected masking pattern comprises completely open contacts or vias in said photoresist layer at a depth less than the thickness of the resist thickness over the area where interconnect lines will be subsequently formed and at a depth over the area where no interconnect lines will be subsequently formed which is more than the depth of the open contacts or vias.

18. The method of claim 11, which further includes the step of varying the % transmission of the transmission chrome of the photomask which varies the U.V. light being transmitted through said photomask and thereby directly varies the depth of the photoresist pattern created in said photoresist layer.

19. The method of claim 11, wherein said work space is located within a stepper or scanner or a step-and-repeat projection system.

20. The method of claim 18, wherein the step of forming said set of openings in selected masking patterns at selected locations in said masking layer comprises transmitting a first amount of light in a selected light wavelength from a light source through a first reticle in a first selected light pattern to said selected location site, then, without removing said semiconductor wafer from said work space, transmitting a second amount of light in a selected light wavelength from said light source through a second reticle in a second selected light pattern to selected location sites.

* * * * *